United States Patent
Jeanne et al.

(10) Patent No.: US 6,891,601 B2
(45) Date of Patent: May 10, 2005

(54) HIGH RESOLUTION, DYNAMIC POSITIONING MECHANISM FOR SPECIMEN INSPECTION AND PROCESSING

(75) Inventors: Alain Jeanne, Amilly (FR); Eric Durand, Amilly (FR); Roger Desailly, Vitry aux Loges (FR)

(73) Assignee: Newport Corporation, Irvine, CA (US)

( * ) Notice: Subject to any disclaimer, the term of this patent is extended or adjusted under 35 U.S.C. 154(b) by 0 days.

(21) Appl. No.: 10/891,719

(22) Filed: Jul. 14, 2004

(65) Prior Publication Data

US 2005/0012920 A1 Jan. 20, 2005

Related U.S. Application Data

(60) Provisional application No. 60/488,141, filed on Jul. 17, 2003.

(51) Int. Cl.[7] .................. G03B 27/58; G03B 27/42; H02K 41/00
(52) U.S. Cl. .................. 355/72; 355/53; 318/135; 310/12
(58) Field of Search .................. 355/53, 72, 75; 318/119, 135; 310/12, 13, 14

(56) References Cited

U.S. PATENT DOCUMENTS

| | | | | |
|---|---|---|---|---|
| 5,204,712 A | * | 4/1993 | Bouwer et al. | 355/53 |
| 6,756,751 B2 | | 6/2004 | Hunter | 318/135 |
| 2004/0080730 A1 | * | 4/2004 | Binnard | 355/53 |

* cited by examiner

*Primary Examiner*—Alan Mathews
(74) *Attorney, Agent, or Firm*—Stoel Rives LLP

(57) ABSTRACT

A specimen positioning mechanism (10) includes a movable stage (12) movable along multiple axes, a plate (35) connected to and supporting a specimen mounting chuck (14), multiple linear displacement mechanisms (36, 38) coupling the plate to the movable stage and mutually spaced apart at different locations between the movable stage and the plate and separately controllable to change distances between the movable stage and the plate, and a flexible member (22) coupling the movable stage and the plate. The flexible member is motion compliant in three axes of motion. The flexible member in response to linear displacements of the linear displacement mechanisms allows linear and rotational movement of the specimen mounting chuck in the three axes of motion compliance.

32 Claims, 4 Drawing Sheets

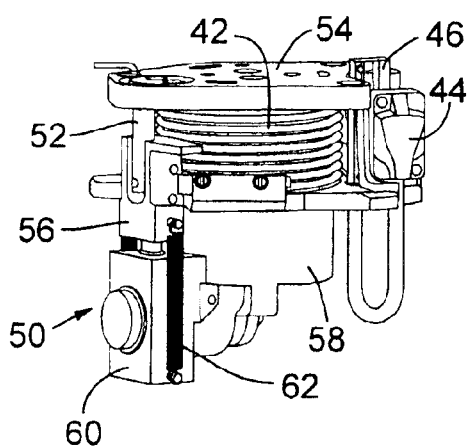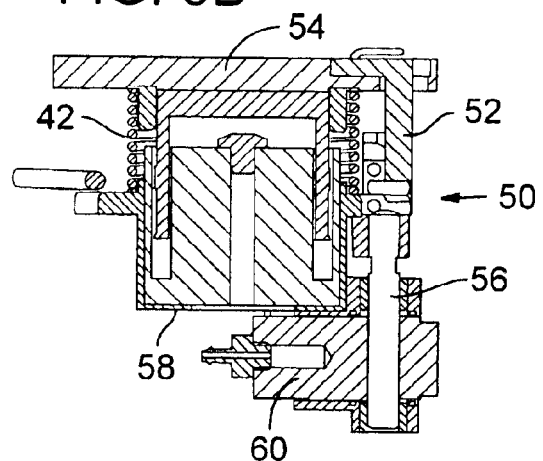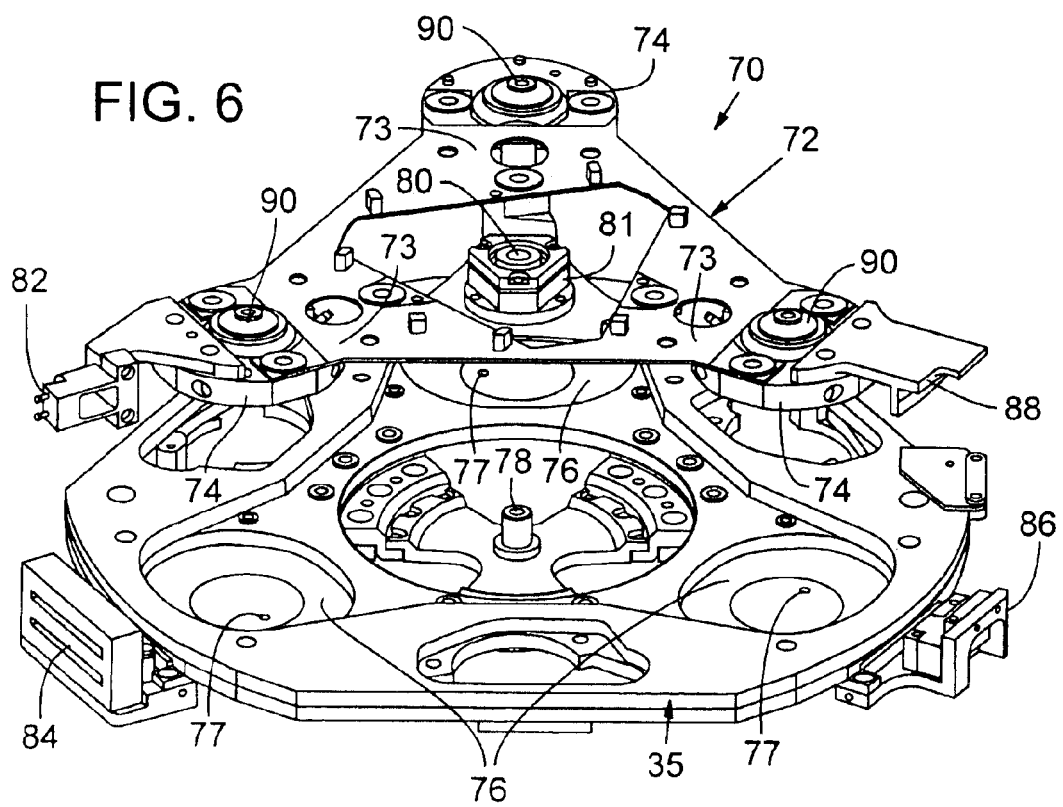

HIGH RESOLUTION, DYNAMIC POSITIONING MECHANISM FOR SPECIMEN INSPECTION AND PROCESSING

RELATED APPLICATION

This application claims benefit of U.S. Provisional Application No. 60/488,141, filed Jul. 17, 2003.

TECHNICAL FIELD

This invention relates to the field of semiconductor processing devices and, more particularly, to a system for dynamically aligning a wafer in Z-, tip-, tilt-, and yaw- (theta) axes relative to a wafer processing device.

BACKGROUND INFORMATION

There are various prior Z Tip Tilt ("ZTT") devices for adjusting the height and parallelism of a semiconductor wafer in a semiconductor processing machine. ZTT devices typically control positioning of Z-axis displacement, rotation about an X-axis, and rotation about a Y-axis while the semiconductor wafer is moving in the X-Y directions under a semiconductor processing machine, such as an optical inspection system. The ZTT device dynamically compensates for non-flatness of the wafer and should be stiff to provide high bandwidth positioning.

Typical ZTT devices are mounted on an X-Y positioning stage and should be sufficiently lightweight and compact to maintain the dynamic performance of the X-Y stage. The ZTT positioning device should also be accurate within a few nanometers, be geometrically stable, and have a sensitive and repeatable driving system. Moreover, ZTT devices should prevent contact between the wafer and the processing system, should not generate particles that could contaminate the wafer, and should be sufficiently reliable to maintain wafer processing throughput.

A conventional approach for providing ZTT positioning integrates two or more separate technologies or products, such as mechanically splitting the Z-axis (vertical) positioning and the tip and tilt positioning, an approach which typically results in very large, high profile, high-mass mechanisms. When splitting the Z-axis and tip/tilt positioning, the most common approach maintains a fixed wafer Z-axis position and, instead, moves the wafer inspection/processing elements. This approach complicates the design of the inspection/processing elements (typically a multi-element optical assembly) and increases the risk of particulate contamination because the vertical translation stage is typically located directly above the wafer. Also, because the moving mass of the Z-axis translation stage (and the elements it carries) is greater than that of a wafer chuck, the resulting dynamic performance is inadequate for many high-throughput applications.

Another conventional approach also mounts the tip and tilt positioners above the wafer. A problem with this approach is maintaining co-location of the inspection/processing system focal point and the tip and tilt positioner axes to prevent X-Y translation of the inspection/processing point as the tip and tilt angles are changed. Of course, mass, complexity, and contamination risk remain problems with this over-wafer configuration.

Several conventional approaches exist for providing tip and tilt positioning beneath the wafer chuck, such as on the X-Y stage carriage. For example, stacking two goniometric cradle stages with coincident rotational axes provides tip and tilt rotation about a common point located at the wafer surface. This approach provides relatively large tip and tilt positioning angles but is problematic because it employs mechanical bearings and drive screws, has a high profile, and cannot directly measure the tip and tilt angles. Alternatively, this cradle approach may be further coupled to a Z-axis stage that is also located on the X-Y stage carriage. The most common conventional Z-axis stages for mounting to an X-Y stage employ either a horizontal wedge driven by a mechanical actuator or linear motor, a single drive screw with a vertical guide way, or three or four small vertical drive screws that turn synchronously to provide Z-axis movement. All these approaches are overly tall and massive to achieve suitable dynamic performance in high throughput applications.

Another conventional tip and tilt positioner approach employs flexure mechanisms driven by mechanical or piezoelectric actuators connected to a support plate that rests on a pivot point defining the center of tip and tilt rotation. In this approach, two identical flexures spaced apart by 90 degrees and at a same radius from the pivot point, provide rotation about one axis and translation along another axis. The combination of rotation and translation creates the tip and tilt positioning. However, the flexures must be compliant through the rotational axis while providing stiffness for the mechanical structure. This tradeoff limits either rotational range or stiffness.

Another conventional flexure approach employs a single stage that provides tip, tilt, and a small amount (less than 1 mm) of Z movement, by simultaneous actuation of two opposing flexures. This approach employs four flexures, a support plate, but no centered pivot point. The four flexures are spaced apart 90 degrees around the circumference of the support plate. Tip and tilt movement is provided by actuating two opposing flexures in opposite directions. Z-axis movement is provided by actuating all four flexures in the same direction. This approach also suffers from limited range or a lack of mechanical stiffness.

In addition to ZTT positioning, many wafer processing applications also require rotational angle (theta) positioning about the Z-axis. Theta positioning typically includes static "fine theta" adjustments for aligning a wafer when it is loaded on a chuck and "dynamic theta" adjustments for maintaining alignment during movements of the X-Y axis positioner. The fine and dynamic theta positioners are typically mounted on the X-Y positioning stage. The fine theta positioner should be close to the wafer to avoid X-Y errors, whereas the dynamic theta positioner should be mounted at a lower position to compensate for parasitic rotations of the wafer.

As with the ZTT positioners, the fine and dynamic theta positioners should be lightweight, compact, and stiff to provide suitable dynamic performances; accurate to within a few nanometers; stable, sensitive, and repeatable; should not generate wafer contaminating particles; and be sufficiently reliable to maintain machine throughput.

A common conventional theta positioner employs a mechanical rotary stage mounted to the X-Y positioning carriage. Such a rotary stage includes a rotating carriage supported by a worm-gear driven radial bearing set. Alternatively, a direct-drive torque motor may drive the stage. However, the mass, height, and inherent mechanical properties of the bearing stage compromise the X-Y stage performance. Moreover, achieving a desired zero-dither performance for the theta stage requires adding a brake or locking mechanism to the stage, which further increases the mass and complexity of the positioner.

A solution for providing suitable theta positioning performance employs a simple two-plate air bearing structure in which a flat reference plate is mounted to the X-Y stage carriage. An upper plate having pressure and vacuum orifices is installed above the reference plate forming an air bearing gap between the two plates. The upper plate is tangentially driven by a linear actuator on one end and is supported by a rigid flexure mechanism on the opposite end to form a pivot point for the theta adjustment. After adjustment, the air bearing pressure supply is blocked, allowing the remaining vacuum to adhere, and thereby lock, the upper and lower plates together. However, because the stage is locked, it cannot provide the dynamic theta adjustments required by some applications. Moreover, the travel range of this approach is limited by the rigid flexure mechanism and by a lateral shift that occurs between the actuator contact point. Another disadvantage of this approach is that the center of rotation is offset from the X-Y carriage center, making it necessary to compensate in X-Y for the theta offset angle.

A solution for providing both very fine theta adjustment within about one degree and high-bandwidth response employs differential positioning of two parallel stages connected by a single perpendicular stage. This approach, referred to as an H-bridge configuration, employs flexures at each end of the single perpendicular stage to allow a small amount of individual mechanical movement between two connected parallel stages. This movement creates an offset angle of the single stage with respect to the parallel axes and, in turn, the desired theta offset functionality. While this solution adds little hardware to the X-Y system to provide theta functionality, it still has a limited travel range and provides no way to lock the theta position. High-bandwidth theta adjustments are possible with the H-bridge configuration, but because flexures are needed to accommodate the differential movement of the parallel stages, the dynamic response of the X-Y stage is reduced by the flexure compliance.

SUMMARY OF THE INVENTION

An object of the invention is, therefore, to provide a wafer positioning stage that provides Z-axis, tip, and tilt positioning in a single mechanism that is integrated with the X-Y carriage without compromising the dynamic performance of the X-Y stage or related system elements.

An advantage of the invention is that it also provides fine and dynamic theta positioning with fine adjustment capability, moderate travel range, high-bandwidth response, zero angular dither at any desired position, negligible influence on X-Y stage throughput, and angular rotation through the X-Y carriage rotational center.

A ZTT positioner of this invention employs a flexible disk that allows Z-axis displacement and tolerates tip and tilt rotations. The disk has minimum mass, stiffness in the X and Y directions, and high damping to avoid vibration. A driving system employs three non-contacting voice coil motors each having a spring to compensate for the moving mass. Position feedback is provided by non-contacting linear encoders coupled to each voice coil motor. The motors and encoders are mutually angularly spaced apart 120 degrees around the circumference of the disk to provide high sensitivity and accuracy.

The ZTT flexible disk includes multiple laminated plates. The upper plate is formed from a very stiff, low mass, ceramic material. The interface to the X-Y stage depends on the application, but could include a theta stage for angular alignment, a lift pin mechanism, and a wafer chuck. The ZTT positioner further includes adjustable hard limits to prevent contact between the wafer and the processing system.

Fine and dynamic theta positioners of this invention together provide fine adjustment capability, moderate travel range, high-bandwidth mechanical response, zero angular dither at the desired position, negligible influence on the X-Y stage throughput, and angular rotation through the center of the X-Y stage. The theta positioner is preferably integrated with the ZTT positioner.

The fine theta positioner employs an air bearing rotary stage with a centered pivot point to allow rotation through a few degrees. The air bearing rides on air pressure that is preloaded with a vacuum. After fine theta alignment, the pressure is shut off, thereby vacuum clamping the fine theta mechanism to a reference surface. The clamping provides a very stiff mechanism having minimum size and mass. The air bearing employs three air pads with an integrated interface for mounting the wafer chuck. The fine theta driving system employs a non-contacting voice coil motor. The angular feedback is provided by a non-contacting, high resolution angular encoder. During clamping, the motor and encoder are in a closed-loop configuration to ensure accurate angular positioning.

The dynamic theta positioner employs a flexible pivot driven by three piezo actuators spaced apart 120 degrees about a pivot point. The flexible parts are oriented to focus rotation about the pivot point, thereby avoiding parasitic X-Y displacements during angular rotation. The three flexible mechanisms each have a small size, but are mounted at a large radial distance from the pivot point to provide high ZXY stiffness even when loaded with several kilograms. The dynamic theta positioner is substantially frictionless and is clean and reliable.

Additional aspects and advantages of this invention will be apparent from the following detailed description of preferred embodiments, which proceeds with reference to the accompanying drawings.

BRIEF DESCRIPTION OF THE DRAWINGS

FIGS. 5A and 5B are respective enlarged isometric and side sectional views depicting in greater detail adjustable hard Z limit components of the ZTT voice coil motor components shown in FIG. 4.

FIG. 6 is an exploded isometric pictorial view of fine theta positioning components shown in FIG. 1.

DETAILED DESCRIPTION OF PREFERRED EMBODIMENTS

Figure 1:
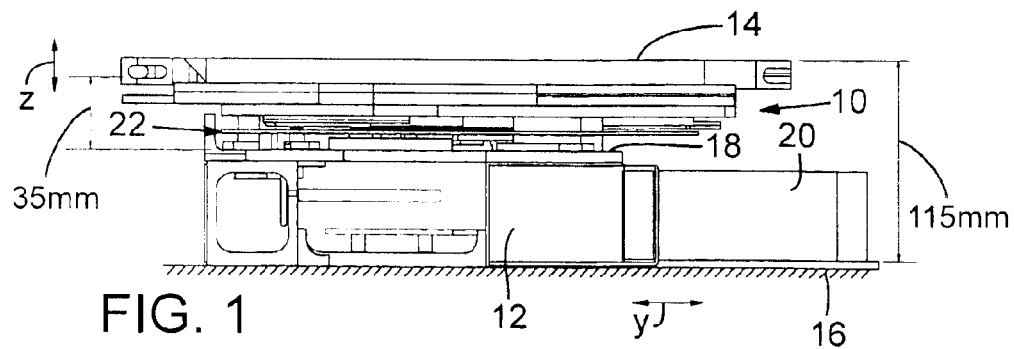
FIG. 1 is a pictorial side elevation view of a preferred embodiment of a ZTT-theta positioner of this invention.
Figure 2:
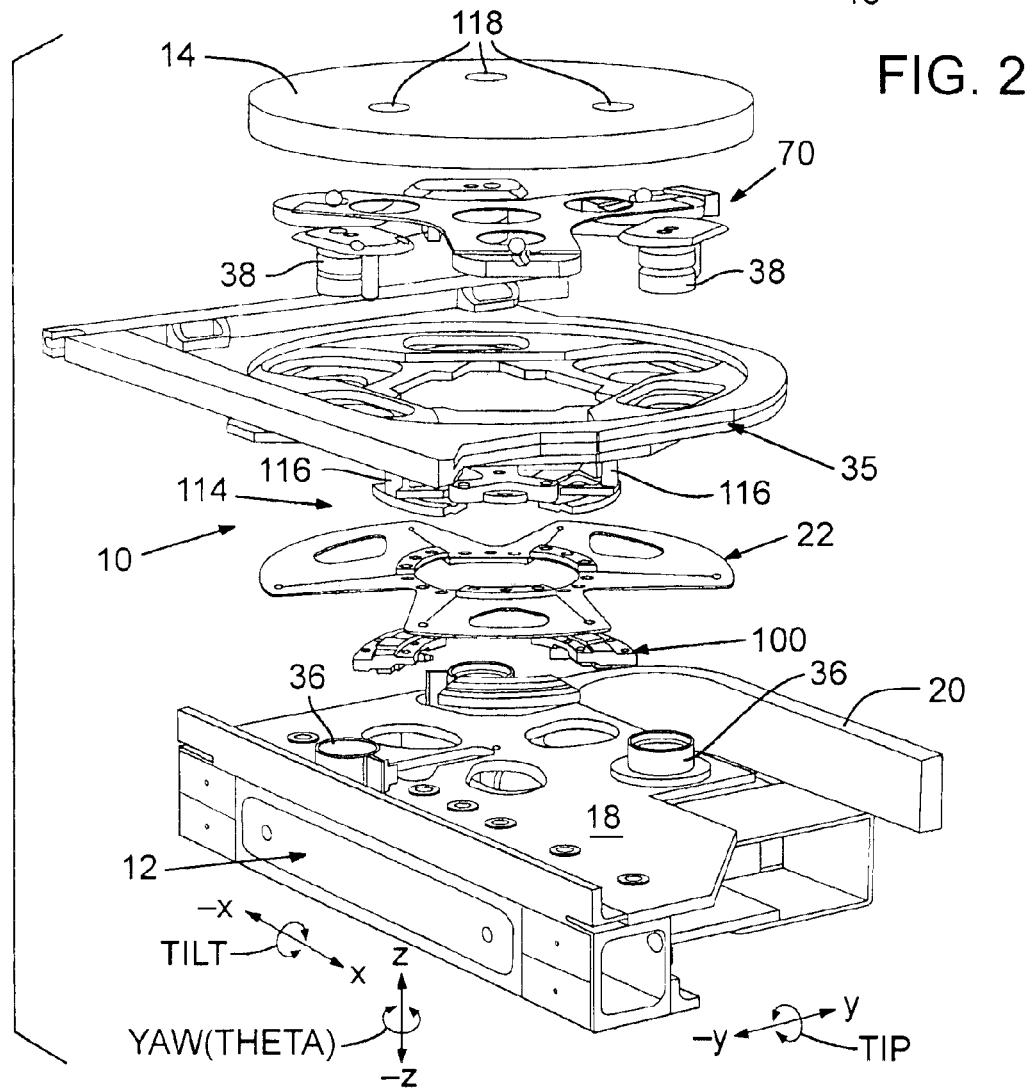
FIG. 2 is an exploded isometric pictorial view of the ZTT-theta positioner of FIG. 1 showing major ZTT positioner components.

FIGS. 1 and 2 show respective side elevation and exploded views of a preferred embodiment of a ZTT-Theta positioner 10, which is assembled between the top of an X-Y stage 12 and the bottom of a wafer mounting chuck 14. X-Y stage 12 moves in X- and Y-axis directions relative to a flat surface 16, such as a granite slab. ZTT-Theta positioner 10 is mounted to an upper surface 18 of X-Y stage 12 and acts to accurately move chuck 14 in the Z-axis direction, tip (roll) chuck 14 about the X-axis, tilt (pitch) chuck 14 about the Y-axis, and rotate (yaw) chuck 14 about the Z-axis. Accordingly, chuck 14 undergoes six-axes of controlled movement in the X, Y, Z, roll, pitch, and yaw directions.

ZTT-Theta positioner 10 is a low-profile assembly occupying only about 35 mm of the total 115 mm height of X-Y stage 12, positioner 10, and chuck 14. X-Y stage 12 is electrically connected to a controller (not shown) by a flexible cable 20. The low-profile reduces angular torque by keeping the mass as low as possible and limiting the amount of rotational inertia.

Figure 3:
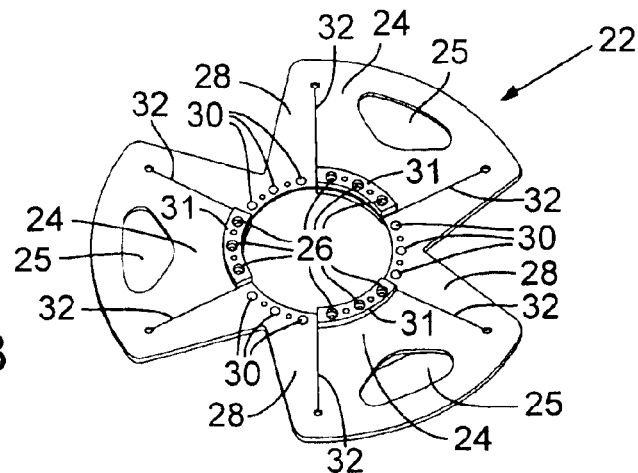
FIG. 3 is an isometric pictorial view of a flexible disk component of the ZTT-theta positioner shown in FIG. 2.

FIG. 3 shows a flexible disk 22 that acts as a guideway for ZTT-Theta positioner 10 by allowing Z-axis displacements and tip and tilt rotations while having high stiffness in the X-axis, Y-axis, and theta directions. Flexible disk 22 is preferably divided into three fixed sectors 24 that includes openings 25 and static mounting points 26 and three movable sectors 28 that have movable mounting points 30. Mounting points 26 and 30 are preferably all at the same radial distance from the rotational center of flexible disk 22. Openings 25 are preferably triangular with rounded corners to reduce stiffness of flexible disk 22 and equalize flexure of sectors 24 and 28. Equalizing the flexure provides a same amount of displacement relative to the radius at the points of attachment. Static mounting points 26 are also formed in mounting interface members 31, which are in the form of annular segments (FIG. 4) and are fitted on the top and bottom sides of static mounting regions 26 of fixed sectors 24 to secure them either directly or indirectly to upper surface 18 of X-Y stage 12. Slits 32 extending radially from the center to points near the periphery of flexible disk 22 intersect the shorter side boundaries of mounting interface members 31. Slits 32 define boundary lines between and permit relative movement in three axes (Z, roll, and pitch directions) of adjacent fixed sectors 24 and movable sectors 28. Mounting interface members 33 in the form of annular segments (FIG. 4) radially extending from a common hub include apertures 34 that are axially aligned with movable mounting points 30. Fasteners (not shown) extending through apertures 24 and movable mounting points 30 secure movable sectors 26 to an upper plate 35 (FIGS. 2 and 4) that supports chuck 14.

Upper plate 35 is preferably formed from silicon carbide (SiC) ceramic material to provide low mass, high stiffness, and low thermal expansion. Sectors 24 and 28 of flexible disk 22 are optimized in size and position to provide a high stiffness in the X, Y, and theta directions. Flexible disk 22 is preferably a multilayered structure that is composed of several thin steel disk elements bonded together with double-sided tape to provide a high damping factor to avoid vibration and improve the ZTT movement bandwidth. A motive force necessary to provide suitable Z-axis displacements is substantially lower than the force required with a single thick disk. Although flexible disk 22 has a relatively low displacement range, it is very reliable because there is no stress in the steel and the double-sided tape bonds large surfaces. Moreover, flexible disk 22 is very clean and operates without lubrication.

Figure 4:
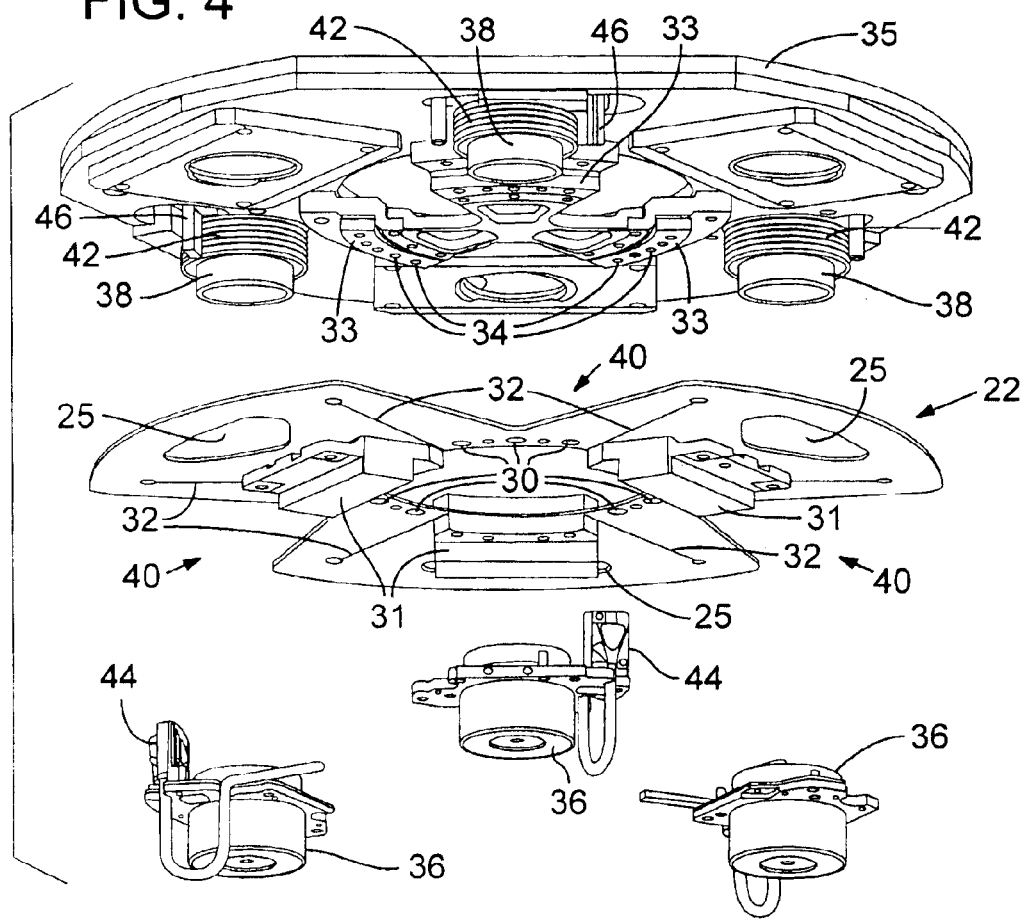
FIG. 4 is an exploded isometric pictorial view of flexible disk, ceramic plate, voice coil motor, and linear encoder scale components of the ZTT-positioner.

FIG. 4 shows a ZTT driving system that movably couples upper plate 35 to X-Y stage 12. The driving system employs multiple extensible mechanisms, preferably three voice coil motors including motor magnets 36 that are fixedly mounted on X-Y stage 12 and motor coils 38 that are attached to upper plate 35. There is no contact between motor magnets 36 and motor coils 38, resulting in a direct drive arrangement between the moving upper plate 35 and X-Y stage 12. As indicated in FIG. 4, motor magnets 36 and motor coils 38 pass through triangular shaped cutout regions 40 in flexible disk 22 and make no contact with it. Reliability is improved by making the gap between motor magnets 36 and motor coils 38 sufficiently large to avoid contact when the tip and tilt angles are at a maximum. The moving mass is compensated for by coil springs 42 that are located around and pass through cutout regions 42 in flexible disk 22 to motor coils 38 provide force against X-Y stage 12. Because flexible disk 22 does not generate significant force over its five mm travel range, coil springs 42 efficiently reduce the electrical current required by motor coils 38, thereby reducing temperature rise and increasing the thermal stability of the ZTT mounting interfaces.

ZTT-Theta positioner 10 provides a ±2 mm Z-axis travel range with 70 nm repeatability and a 5 $\mu$m step and settle time of 40 msec. ZTT-Theta positioner 10 also provides ±0.5 mdegree tip and tilt rotational ranges with 2 $\mu$radian repeatability. Alternatively, extensible mechanisms including short stroke linear motors (of which voice coil motors are of one type) and piezoelectric mechanisms may be employed.

ZTT position sensing is provided by three linear optical encoders, each of which includes an optical sensor head 44 and a linear scale 46 (FIG. 5A), optical sensor heads 44 are mounted adjacent to motor magnets 36 on X-Y stage 12, and linear scales 46 are mounted adjacent to coil springs 42 on upper plate 35. Linear scales 46 have a large range of angular tolerance that allows accurate Z displacement measurements when the tip and tilt angles are maximum. The three Z positions are sufficiently well known to provide a Z-axis translation resolution of 20 nm.

The three motor coils 38 and linear scales 46 are mounted in height-reducing recesses formed in upper plate 35. Metallic inserts in the recesses provide high stiffness mounting surfaces. The mounting surfaces are also very accurate and flat because of the ceramic material processes forming upper plate 35. Upper plate 35 further includes the necessary interface for mounting an air bearing rotary stage and a lift pin mechanism for wafer leveling on chuck 14 and optional theta alignment mechanisms that are described with reference to FIGS. 6–8. Upper plate 35 also includes optional interfaces for mounting any ancillary components necessary for particular wafer processes. Finally, reference mirrors may be mounted on upper plate 35 to accommodate interferometer-based X-Y positioning measurements.

FIGS. 5A and 5B show respective isometric and side sectional views of a Z-axis movement adjustable hard limit mechanism 50 of this invention. ZTT-Theta positioner 10 preferably employs three hard limit mechanisms 50, each of which is integrated with the supports for motor magnets 36 and motor coils 38. A static fork 52 is mounted on a motor coil support 54, and a moving fork 56 is mounted on a motor magnet support 58, which is attached to upper surface 18 of X-Y stage 12. The guideway of moving fork 56 is a pneumatic jack 60 that includes a clamping capability. A spring 62 preloads moving fork 56 to provide Z-axis downward displacement bias. Motor magnets 36 and motor coils 38 provide the driving motive force for adjusting the position of moving fork 56.

During the adjustment process, moving fork 56 is unclamped and driven upward by pneumatic jack 60 against the urging of spring 62. Meanwhile, the ZTT controller moves motor coils 38 and thereby static forks 52 to the commanded upper hard limit, at which position moving forks 56 are clamped by pneumatic jack 60. The upper hard limit positioning is very precise because it employs ZTT motor coils 38 and its associated linear scale 46. Accordingly, Z-axis displacement can be very close to the upper hard limit. Hard limit mechanisms 50 are equally spaced about the periphery of ZTT-Theta positioner 10, the diameter of which is sufficiently close to the wafer diameter to avoid Z-axis offsets in the presence of tip and tilt angles.

ZTT-Theta positioner 10 optionally includes fine and dynamic theta positioner mechanisms.

FIG. 6 shows a fine theta positioner 70 of this invention that includes a flexible disk 72 formed as a multilayered structure that is composed of several thin steel disks are bonded together with double-sided tape to provide a high damping factor. Flexible disk 72 provides stiffness in the X, Y, and theta directions and efficient decoupling in the Z-axis direction.

Flexible disk 72 includes three arms 73 mutually angularly spaced apart by 120 degrees. The end of each arm includes an air pad 74, which expels from its periphery pressurized air to form an air bearing region for frictionless movement of air pad 74 across a reference surface 76 embedded in upper plate 35. Within reference surface 76 is a vacuum port 77 that provides an offsetting vacuum pressure bias that is slightly less than the air pressure creating the air bearing. When the air pressure is interrupted, the vacuum pressure dominates and clamps air pad 74 to reference surface 76, thereby locking in the currently selected fine theta positioning angle. The air bearings also contribute to improved reliability, and the high damping factor of flexible disk 72 avoids vibrations, reduces parasitic forces on air pads 74, and improves fine theta positioning bandwidth.

A ball bearing 78 fitted into a pedestal mounted on upper plate 35 rides in a centered pivot point 80 fitted in a hub 81 of flexible disk 72 that defines the center of theta rotation. The three air pads 74 are affixed and thereby linked to ball bearing 78 by flexible disk 72. Alternatively, air pads 74 may include ports for both the pressurized air and vacuum pressure, or some combination of permanent-magnets, electromagnets, and springs may provide suitable attracting and/or repulsing forces.

The fine theta driving system employs a voice coil motor that includes a motor coil 82 that is attached outboard of one of air pads 74 and a motor magnet 84 that is attached to X-Y stage 12. The maximum radial position of motor coil 82 provides sufficient torque for the small, low mass voice coil motor. The voice coil motor provides non-contacting, direct drive between air pads 74 and X-Y stage 12. Reliability is increased by making the gap between motor coil 82 and motor magnet 84 sufficiently large to avoid contact when the fine theta angle is maximized.

Fine theta position feedback is provided by a rotary encoder that includes an optical sensor 86 that is mounted on X-Y stage 12 and an encoder scale 88 that is mounted outboard of one of air pads 74. The rotary encoder provides direct angular information of the fine theta angle. Encoder scale 88 employs a Renishaw encoder supporting less than five $\mu$radians of resolution across ±3 degrees of rotation.

Fine theta positioner 70 includes an angular clamping capability. During angular alignment, the air bearing is pressurized and there is, therefore, no friction to impede a sensitive, accurate angular displacement. When the target angular position is reached, the air pressure is cut off, allowing the vacuum to clamp air pads 74 to reference surfaces 76. The high preload of the vacuum ensures a stiff and stable theta angle relative to X-Y stage 12. During clamping, the controller servo loop is closed to ensure an accurate target alignment angle. After clamping, the servo loop is opened to eliminate current flow through motor coil 82, thereby eliminating heat generation to ensure thermal stability.

Each of air pads 74 further includes a chuck mounting interface 90 composed of a cone and a ball that decouple theta stresses from chuck 14. Chuck 14 is rigidly affixed to air pads 74 by screws.

Figure 7:
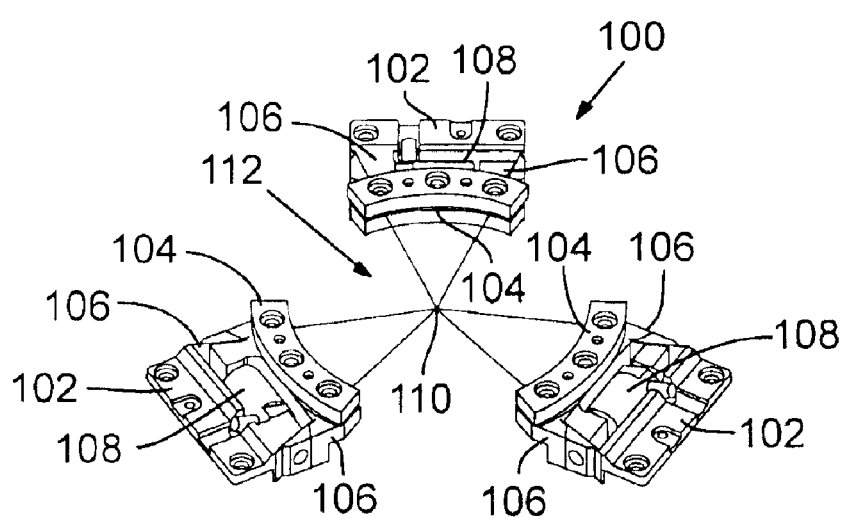
FIG. 7 is an exploded isometric pictorial view of dynamic theta positioning components of this invention.

FIG. 7 shows a dynamic theta positioner 100 of this invention that includes three static bases 102 mounted at 120-degree intervals on a reference surface, such as X-Y stage 12. Dynamic theta positioner 100 further includes three movable bases 104 that are interconnected to static bases 102 by flexures 106. Flexures 106 provide decoupling between static and movable bases 102 and 104, which are linked together by piezo actuators 108. Movable bases 104 are coupled to static points 26 of flexible disk 22 (FIG. 3). When optionally installed, dynamic theta positioner 100 renders unnecessary and therefore replaces the flexible disk mounting interface 31 shown in FIG. 4.

The orientation of the decoupling between static and movable bases 102 and 104 is directed radially toward a centered pivot point 110 that provides accurate theta rotation without X-Y parasitic displacement. Flexures 106 are optimized to ensure high stiffness in the X-Y directions. The spacings between adjacent ones of the three pairs of interconnected static bases 102 and movable bases 104 are sufficiently large to provide high stiffness in the Z-axis, tip, and tilt directions. The spacings also provide a free area 112 for integrating other functions, such as ZTT, fine theta, and an optional lift pin mechanism 114 for assisting wafer loading on chuck 14. Lift pin mechanism 114 integrates with fine theta positioner 70 (FIG. 6) and includes three tubular vacuum supply lines 116 that extend upwardly through holes 118 in chuck 14 (FIG. 2). Lift pin mechanism 114 provides vacuum supply lines 116 with about 6 mm of travel for vacuum gripping and moving wafers to and from chuck 14. All other integrated functions are mounted above dynamic theta positioner 100 to ensure proper dynamic theta alignment.

Piezo actuators 108 are preloaded for displacement in forward and reverse direction without hysteresis. Piezo actuators 108 include integrated position sensors to provide accurate displacements without drift and hysteresis.

Angular position feedback may be provided by the optical system that measures wafer alignment during XY displacement, or be provided by an interferometer having reference mirrors mounted close to chuck 14 or the wafer. In either alternative, dynamic theta positioner 100 provides dynamic rotation of the wafer to within 0.5 $\mu$radian across an angular travel of ±10 $\mu$radians.

Referring again to FIG. 2, shown are the spatial relationships among various components of the ZTT positioner, fine theta positioner 70, and dynamic theta positioner 100 of this invention.

Skilled workers will recognize that portions of this invention may be implemented differently from the implementations described above for preferred embodiments.

It will be obvious to those having skill in the art that many changes may be made to the details of the above-described embodiments without departing from the underlying principles of the invention. The scope of this invention should, therefore, be determined only by the following claims.

We claim:

1. A high resolution, dynamic specimen positioning mechanism, comprising:
   a movable stage operable for movement in directions along multiple axes;
   a plate operatively connected to a specimen mounting chuck to support it;
   multiple linear displacement mechanisms coupling the plate to the movable stage, the linear displacement mechanisms mutually spaced apart at different locations in a space between the movable stage and the plate and controllable to change distances in the space between the movable stage and the plate at the different locations; and
   a flexible member operatively connected to the movable stage and the plate, the flexible member being motion constrained in three axes of motion and motion compliant in three different axes of motion, the flexible member in response to linear displacements of the linear displacement mechanisms allowing linear and rotational movement of the specimen mounting chuck in the three axes of motion compliance.

2. The specimen positioning mechanism of claim 1, in which the flexible member is divided into two groups of multiple sections configured for relative movement, the first group secured to the movable stage and the second group secured to the plate.

3. The specimen positioning mechanism of claim 2, in which the flexible member is generally in the shape of a disk and in which the two groups of multiple sections include members arranged so that a member of one of the groups is positioned between members of the other one of the groups.

4. The specimen positioning mechanism of claim 3, in which the flexible member has a center and a periphery, and in which adjacent pairs of the members of the groups are separated by a slit radially extending from the center to a location near the periphery of the flexible member.

5. The specimen positioning mechanism of claim 4, in which the first group is secured to the movable stage at first attachment points and the second group is secured to the plate at second attachment points, the first and second attachment points being substantially equidistant from the center of the flexible member.

6. The specimen positioning mechanism of claim 1, in which the movable stage is operable for movement along X- and Y-axes, and in which the flexible member is motion compliant along a Z-axis and roll and pitch axes.

7. The specimen positioning mechanism of claim 1, in which each of the linear displacement mechanisms includes an extensible mechanism secured between the movable stage and the plate in a noncontacting relationship.

8. The specimen positioning mechanism of claim 1, in which at least one of the linear displacement mechanisms includes a short stroke linear motor.

9. The specimen positioning mechanism of claim 8, in which the short stroke linear motor includes a voice coil motor.

10. The specimen positioning mechanism of claim 7, further including a spring that extends between the movable stage and the plate to compensate for its moving mass.

11. The specimen positioning mechanism of claim 7, in which the flexible member includes cutout regions through which the extensible mechanisms pass to prevent physical contact with the flexible member.

12. The specimen processing mechanism of claim 1, in which one of the motion compliant axes of motion defines a direction of linear displacement of the linear displacement mechanisms, and further comprising an angular positioning mechanism operatively coupled to the plate and the specimen mounting chuck to impart angular displacement of the specimen mounting chuck about the direction of linear displacement.

13. The specimen positioning mechanism of claim 12, in which:
   the plate includes multiple reference surfaces;
   the angular positioning mechanism is rotatably mounted to the plate, the angular positioning mechanism including multiple arms to each of which is mounted a fluid pad; and
   the multiple arms extending from and angularly spaced apart about a central portion, the multiple arms spatially aligned with different ones of the reference surfaces to form fluid bearing pressure surfaces;
   and further comprising:
   a drive device operatively coupled to the angular positioning mechanism to rotatably move it relative to the plate.

14. The specimen positioning mechanism of claim 13, in which the fluid bearing pressure surfaces include positive and negative fluid pressure regions.

15. The specimen positioning mechanism of claim 13, in which the fluid bearing pressure surfaces are biased apart or together by at least one of air pressure, vacuum pressure, magnetic attraction, magnetic repulsion, and spring tension.

16. The specimen positioning mechanism of claim 12, in which the angular positioning mechanism includes a flexible disk formed by multiple layers of material bonded together.

17. The specimen positioning mechanism of claim 13, in which the drive device includes an electromechanical device that includes a magnet and a coil secured to different ones of the angular positioning mechanism and the movable stage.

18. The specimen positioning mechanism of claim 17, in which the electromechanical device includes a voice coil motor.

19. The specimen positioning mechanism of claim 12, in which the angular positioning mechanism includes a chuck mounting interface for the specimen mounting chuck to decouple angular positioning stresses from it.

20. The specimen positioning mechanism of claim 12, further comprising a rotary encoder that provides angular position feedback, the rotary encoder including an optical sensor and an encoder scale associated with different ones of the angular positioning mechanism and the movable stage.

21. The specimen positioning mechanism of claim 1, in which one of the motion compliant axes of motion defines a direction of linear displacement of the linear displacement mechanism, and further comprising:
   a dynamic positioning mechanism including first and second base portions operatively coupled to, respectively, the movable stage and the flexible member; and
   a drive mechanism operatively coupled to the first and second base portions to impart relative movement to them and thereby angular displacement of the specimen mounting chuck about the direction of linear displacement.

22. The specimen positioning mechanism of claim 21, in which:
   the first base portion includes multiple mutually angularly spaced-apart static base components that are mounted to the movable stage, and the second base portion includes components that are attached by flexible members to different ones of the static base components, the flexible members providing the coupling between associated pairs of the static and movable base components along the multiple axes of motion of the movable stage; and the drive mechanism links each associated pair of static and movable base components to impart the relative movement between them.

23. The specimen positioning mechanism of claim 21, in which the flexible member is divided into multiple motion constrained sections and multiple motion compliant sections, and in which the movable base components are coupled to the motion constrained sections of the flexible member.

24. A high resolution, dynamic specimen positioning mechanism, comprising:
   a movable stage operable for movement in directions along multiple axes;
   a plate operatively connected to a specimen mounting chuck to support it;
   multiple linear displacement mechanisms coupling the plate to the movable stage, the linear displacement mechanisms positioned in a space between the movable stage and the plate and controllable to change distances in the space between the movable stage and the plate;
   a flexible member operatively connected to the movable stage and the plate, the flexible member being motion compliant in three axes of motion, one of which defines a direction of linear displacement of the linear displacement mechanisms, and the flexible member in response to linear displacements of the linear displacement mechanisms allowing linear and rotational movement of the specimen mounting chuck in the three axes of motion compliance; and
   an angular positioning mechanism operatively coupled to the plate and the specimen mounting chuck to impart angular displacement of the specimen mounting chuck about the direction of linear displacement.

25. The specimen positioning mechanism of claim 24, in which the flexible member is divided into two groups of multiple sections configured for relative movement, the first group secured to the movable stage and the second group secured to the plate.

26. The specimen positioning mechanism of claim 25, in which the flexible member is generally in the shape of a disk and in which the two groups of multiple sections include members arranged so that a member of one of the groups is positioned between members of the other one of the groups.

27. The specimen positioning mechanism of claim 24, in which the movable stage is operable for movement along X- and Y-axes, and in which the flexible member is motion compliant along a Z-axis and roll and pitch axes.

28. The specimen positioning mechanism of claim 24, in which each of the linear displacement mechanisms includes an extensible mechanism secured between the movable stage and the plate in a noncontacting relationship.

29. The specimen positioning mechanism of claim 24, in which:
   the plate includes multiple reference surfaces;
   the angular positioning mechanism is rotatably mounted to the plate, the angular positioning mechanism including multiple arms to each of which is mounted a fluid pad; and
   the multiple arms extending from and angularly spaced apart about a central portion, the multiple arms spatially aligned with different ones of the reference surfaces to form fluid bearing pressure surfaces;
   and further comprising;
   a drive device operatively coupled to the angular positioning mechanism to rotatably move it relative to the plate.

30. The specimen positioning mechanism of claim 24, in which the angular positioning mechanism includes a flexible disk formed by multiple layers of material bonded together.

31. The specimen positioning mechanism of claim 24, in which the angular positioning mechanism includes a chuck mounting interface for the specimen mounting chuck to decouple angular positioning stresses from it.

32. The specimen positioning mechanism of claim 24, further comprising:
   a dynamic positioning mechanism including first and second base portions operatively coupled to, respectively, the movable stage and the flexible member; and
   a drive mechanism operatively coupled to the first and second base portions to impart relative movement to them and thereby angular displacement of the specimen mounting chuck about the direction of linear displacement.

* * * * *